(12) United States Patent
Oikawa et al.

(10) Patent No.: US 10,928,452 B2
(45) Date of Patent: Feb. 23, 2021

(54) PARAMETER DETERMINATION SUPPORT DEVICE, AND NON-TRANSITORY COMPUTER-READABLE MEDIUM ENCODED WITH PROGRAM

(71) Applicant: FANUC CORPORATION, Yamanashi (JP)

(72) Inventors: Kouki Oikawa, Yamanashi (JP); Yuuki Morita, Yamanashi (JP); Tadashi Okita, Yamanashi (JP)

(73) Assignee: FANUC CORPORATION, Yamanashi (JP)

( * ) Notice: Subject to any disclaimer, the term of this patent is extended or adjusted under 35 U.S.C. 154(b) by 97 days.

(21) Appl. No.: 16/271,595

(22) Filed: Feb. 8, 2019

(65) Prior Publication Data

US 2019/0257883 A1    Aug. 22, 2019

(30) Foreign Application Priority Data

Feb. 16, 2018 (JP) .............................. JP2018-026167

(51) Int. Cl.
    *G01R 31/34* (2020.01)
(52) U.S. Cl.
    CPC .................................. *G01R 31/34* (2013.01)
(58) Field of Classification Search
    CPC .............................. H02P 23/14; G01R 31/34
    See application file for complete search history.

(56) References Cited

U.S. PATENT DOCUMENTS

| | | | |
|---|---|---|---|
| 6,696,812 B2* | 2/2004 | Kaneko | B60L 50/51 318/700 |
| 9,018,870 B2* | 4/2015 | Kobayashi | B60W 20/00 318/400.02 |
| 9,312,799 B2* | 4/2016 | Kato | H02P 21/0089 |

FOREIGN PATENT DOCUMENTS

| | | |
|---|---|---|
| JP | 2003-316422 A | 11/2003 |
| JP | 2004-297966 A | 10/2004 |

(Continued)

OTHER PUBLICATIONS

An Office Action; "Notification of Reasons for Refusal," mailed by the Japanese Patent Office dated Jan. 21, 2020, which corresponds to Japanese Patent Application No. 2018-026167 and is related to U.S. Appl. No. 16/271,595; with English language translation.

*Primary Examiner* — Elias Desta
(74) *Attorney, Agent, or Firm* — Studebaker & Brackett PC

(57) ABSTRACT

To simplify determination of drive parameters upon driving a motor for which circuit constants are unknown, and shorten the time required in determination. A parameter determination support device includes: an automatic measurement part which automatically measures acceleration (rpm/s) of the synchronous motor and D-phase current (A) of the motor drive device, as operating information upon driving while accelerating the synchronous motor under each condition of a first condition based on a base speed, and a second condition in which the D-phase current (A) of the motor drive device was changed from the first condition, according to the test-run program, by applying the initial parameter; an estimation part which estimates an inductance ratio (dimensionless) and a Q-phase inductance (mH), as circuit constants of the synchronous motor, based on the operating information; and a calculation part for performing calculation of an optimum parameter tailored to the output (Continued)

specification of the synchronous motor, based on the circuit constants.

4 Claims, 8 Drawing Sheets

(56) References Cited

FOREIGN PATENT DOCUMENTS

| JP | 2007-159212 A | 6/2007 |
| JP | 2010-011638 A | 1/2010 |
| JP | 2015-133778 A | 7/2015 |

* cited by examiner

| Parameter No. | Before | After |
|---|---|---|
| No.4065 | 0 | 1223 |
| No.4112 | 2425 | 1231 |
| No.4103 | 2425 | 2297 |
| No.4105 | 2525 | 2162 |
| No.4113 | 241 | 243 |
| No.4116 | 408 | 433 |
| No.4117 | 577 | 558 |

FIG. 8

PARAMETER DETERMINATION SUPPORT DEVICE, AND NON-TRANSITORY COMPUTER-READABLE MEDIUM ENCODED WITH PROGRAM

This application is based on and claims the benefit of priority from Japanese Patent Application No. 2018-026167, filed on 16 Feb. 2018, the content of which is incorporated herein by reference.

BACKGROUND OF THE INVENTION

Field of the Invention

The present invention relates to parameter determination support device, and a non-transitory computer-readable medium encoded with a program.

Related Art

In order to control a servomotor used in a servo mechanism included in a machine tool, a packaging machine, an industrial robot, etc., it is necessary to set drive parameters for driving the servomotor to the appropriate value. As a method of setting this drive parameter, for example, Patent Document 1 discloses a technique which acquires the parameters of a drive system, operates the drive system with a test operation program produced according to the obtained parameters, and adjusts the parameters of the controller based on the results of analyzing the test data obtained upon the operation.

Patent Document 1: Japanese Unexamined Patent Application, Publication No. 2003-316422

SUMMARY OF THE INVENTION

Patent Document 1 is premised on the circuit constants such as the resistance value or inductance of a motor already being known; however, in the case of driving a motor for which the circuit constant is unknown, or a motor for which the precision of the value suggested as the circuit constant is unclear, it is necessary to determine the initial parameter for test running from known information such as the rated output and base revolution speed of the motor, and determine the optimum drive parameters based on data such as the current value and speed measured upon performing a test run under specific operations. However, since the procedure for determining the optimum drive parameters is complicated, the technician must have skill, and time is required in the determination of the optimum driving parameters.

The present invention has an object of providing a parameter determination support device and non-transitory computer-readable recording medium capable of simplifying determination of driving parameters upon driving a motor for which the circuit constant is unknown, and shortening the time require in determination.

A parameter determination support device (for example, the parameter determination support device 11 described later) for motor driving according to a first aspect of the present invention includes: an acquisition means (for example, the acquisition part 114 described later) for acquiring specification information of a motor drive device (for example, the motor drive device 31 described later) and output specification information of a synchronous motor (for example, the synchronous motor 41 described later); an initial parameter determination means (for example, the initial parameter determination part 115 described later) for determining an initial parameter for test running, based on the specification information and the output specification information; a program creation means (for example, the program creation part 116 described later) for creating a test-run program to be used in test running for acquiring data that is required for adjustment of a parameter that determines output of the synchronous motor, based on the output specification information; an automatic measurement means (for example, the automatic measurement part 117 described later) for automatically measuring acceleration of the synchronous motor and D-phase current of the motor drive device, as operating information upon driving while accelerating the synchronous motor under each condition of a first condition based on a base speed, and a second condition in which the D-phase current of the motor drive device was changed from the first condition, according to the test-run program, by applying the initial parameter; an estimation means (for example, the estimation part 118 described later) for estimating an inductance ratio and a Q-phase inductance, as circuit constants of the synchronous motor, based on the operating information; and a calculation means (for example, the calculation part 119 described later) for performing calculation of an optimum parameter tailored to the output specification of the synchronous motor, based on the circuit constants.

According to a second aspect of the present invention, the parameter determination support device as described in the first aspect may further include: a detection means (for example, the detection unit described later) for detecting the specification information; and an input means (for example, the input unit described later) for an operator to input the output specification information, in which the acquisition means may acquire the specification information from the detection means, and acquire the output specification information from the input means.

According to a third aspect of the present invention, the parameter determination support device as described in the first or second aspect may further include a display means (for example, the display part 120 described later) for displaying at least one among the operating information which was measured, the circuit constants which were estimated, and the optimum parameter which was calculated.

A non-transitory computer readable medium encoded with a program according to a fourth aspect of the present invention causes a computer to operate as the parameter determination support device as described in any one of the first to third aspects.

According to the present invention, it becomes possible to simplify the determination of drive parameters upon driving a motor for which the circuit constants are unknown, and shorten the time required in determination.

BRIEF DESCRIPTION OF THE DRAWINGS

FIG. 8 is a view showing a screen displaying calculated optimum parameters on a screen.

DETAILED DESCRIPTION OF THE INVENTION

Figure 1:
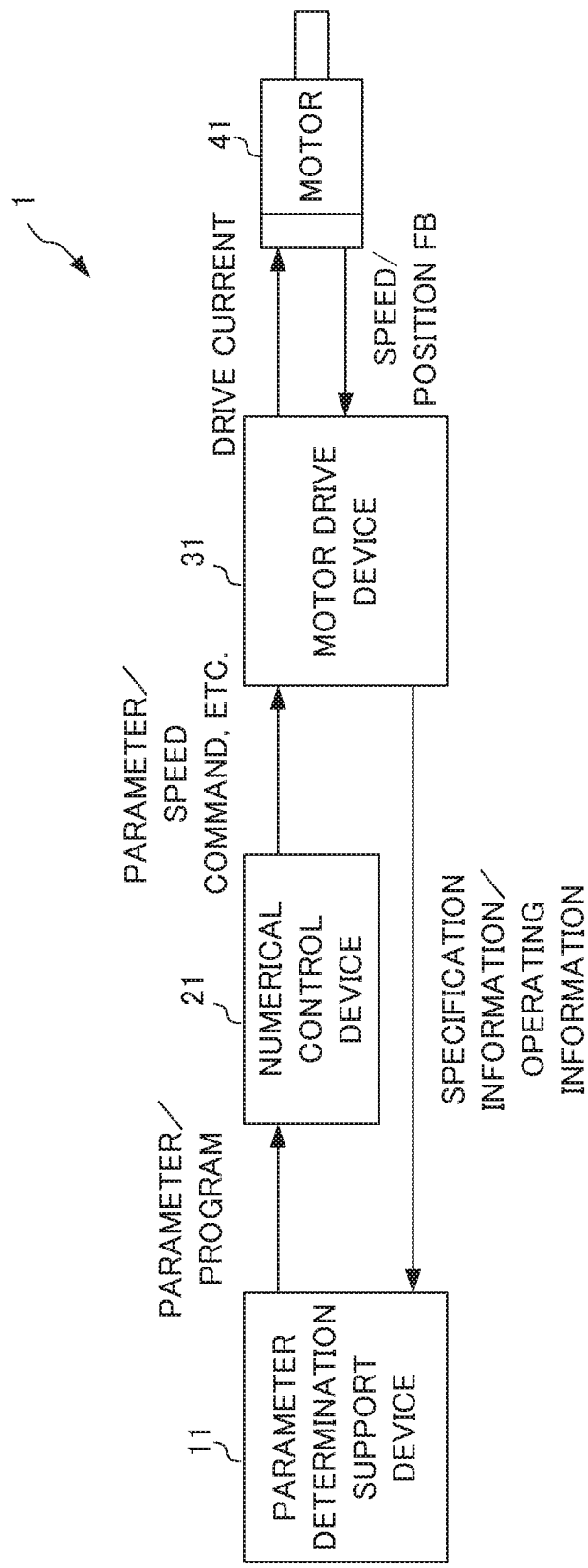
FIG. 1 is a block diagram showing the overall configuration of a motor drive system which includes a parameter determination support device according to an embodiment of the present invention.

Hereinafter, an embodiment of the present invention will be described in detail while referencing FIGS. 1 to 8. FIG. 1 shows the overall configuration of a motor drive system 1 which includes a parameter determination support device according to an embodiment of the present invention. In addition to the parameter determination support device 11, the motor drive system 1 is equipped with a numerical control device 21, a motor drive device 31, and a synchronous motor 41.

The parameter determination support device 11 determines initial parameters for test running of the synchronous motor 41, based on the specifications of the motor drive device 31 received from the motor drive device 31, and output specification information of the synchronous motor 41 inputted by the operator to the parameter determination support device 11; and creates a test running program for performing test runs based on the specification information, output specification information and initial parameters. In order to estimate the circuit constants of the synchronous motor 41, when rotating the synchronous motor 41 at a substantially constant revolution speed (substantially constant speed), and accelerating and decelerating, it is necessary to confirm the data such as drive current value, drive voltage value and revolution speed (operating information); however, "test run" herein is the matter of a test run causing the synchronous motor 41 to drive in order for confirmation of these data. In addition, "drive voltage value" is the voltage required to actually drive the synchronous motor 41 at a certain revolution speed, and is calculated based on the voltage of the power source, and/or command value for voltage. In addition, "initial parameters" herein, for example, include at least one among the maximum current value for driving the synchronous motor 41, D-phase current value, highest revolution speed of the synchronous motor 41, and coefficient converting the feedback of current value introduced from the motor drive device 31 into an actual physical quantity. In addition, "output specification information" herein includes at least one among the rated output and base revolution speed of the synchronous motor 41.

Furthermore, the parameter determination support device 11 sends this initial parameter and test-run program to the numerical control device 21. The numerical control device 21 generates command values such as the position command value and speed command value by executing the test-run program applying the initial parameter, and sends to the motor drive device 31 along with the initial parameter.

The motor drive device 31 supplies the drive current based on the initial parameter and command values received from the numerical control device 21 to the synchronous motor 41.

The synchronous motor 41 sends feedback values of the speed information, position information, revolution speed, etc. to the motor drive device 31.

The motor drive device 31 sends to the parameter determination support device 11 the operating information including the feedback values received from the synchronous motor 41, drive current value, command value to the synchronous motor 41, etc. It should be noted that "operating information" herein includes the revolution speed SPEED (rpm) and acceleration ACC (rpm/s) of the synchronous motor 41, as well as the D-phase current ID (A) of the motor drive device 31, and may include the DC link voltage VDC (V) and Q-phase voltage command VQCMD (%) of the motor drive device 31. The "D-phase current" is a current flowing through a D-axis coil when the synchronous motor is represented as a two-phase equivalent circuit corresponding to a D-axis, which is a magnetic field direction created by a rotor of the synchronous motor, and a Q-axis, which is a magnetic field direction perpendicular to the D-axis.

The parameter determination support device 11 estimates the circuit constant of the synchronous motor 41, based on the operating information received from the motor drive device 31 and known values. Furthermore, the parameter determination support device 11 performs calculation of the optimum parameter tailored to the output specifications of the synchronous motor 41 based on this circuit constant, and sends this optimum parameter to the numerical control device 21. It should be noted that "circuit constant" herein includes an inductance ratio Lq/Ld (dimensionless) and Q-phase inductance Lq (mH). In addition, "known values" includes the short circuit current Isc (Arms) and D-phase inductance Ld (mH), and may include the reverse voltage constant Ke (V/krpm) and the number of pairs of poles Poles (dimensionless) of the synchronous motor 41. The Q-phase inductance is an ease of passage of magnetic flux in a Q-axis magnetic path when the synchronous motor is represented as the two-phase equivalent circuit corresponding to the D-axis and the Q-axis.

Figure 2:
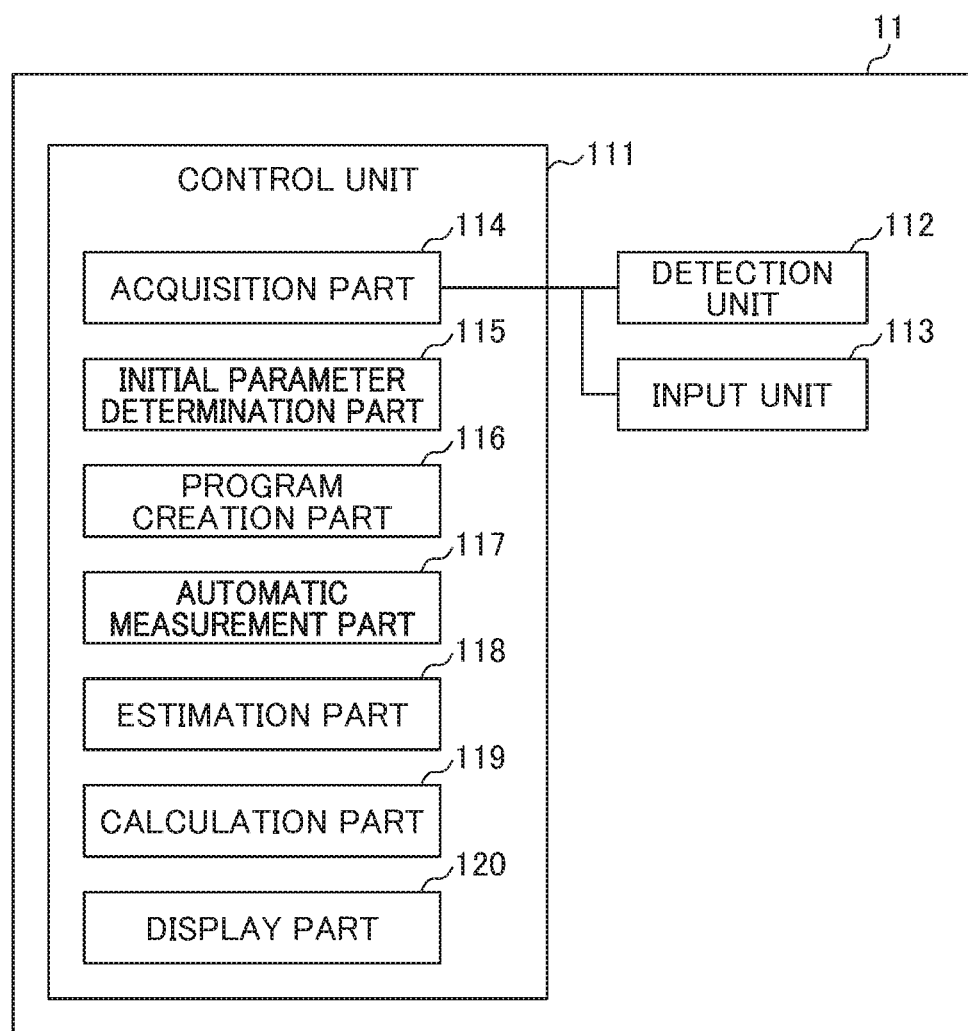
FIG. 2 is a block diagram showing the functions of the parameter determination support device shown in FIG. 1.

FIG. 2 is a block diagram showing the functions of the parameter determination support device 11. The parameter determination support device 11 includes a control unit 111, detection unit 112 and input unit 113, and further, the control unit 111 includes an acquisition part 114, initial parameter determination part 115, program creation part 116, automatic measurement part 117, estimation part 118, calculation part 119 and display part 120.

The control unit 111 has a CPU, ROM, RAM, CMOS memory, etc., and these are known components to persons skilled in the art, configured to be communicable with each other via a bus. The CPU is a processor which controls the parameter determination support device 11 overall. By this CPU reading out a system program and application programs stored in the ROM via a bus, and controlling the parameter determination support device 11 overall in accordance with this system program and application program, the control unit 111 is configured so as to realize the functions of the acquisition part 114, initial parameter determination part 115, program creation part 116, automatic measurement part 117, estimation part 118, calculation part 119 and display part 120. Various types of data such as temporary calculation data and display data are stored in the RAM. The CMOS memory is configured as non-volatile memory which is backed up by a battery (not shown), and in which the stored state is maintained even if the power source of the parameter determination support device 11 is turned OFF.

The acquisition part 114 acquires the specification information of the motor drive device 31 and the output specification information of the synchronous motor 41. Specifically, the acquisition part 114 acquires specification information of the motor drive device 31 from the detection part 112 described later, and acquires output specification information of the synchronous motor 41 from the input unit 113 described later.

The initial parameter determination part 115 determines the initial parameter for test running, based on the specification information and output specification information acquired by the acquisition part 114.

The program creation part 116 creates a test-run program based on the output specification information acquired by the acquisition part 114. This test-run program is used in test running for acquiring data required in the adjustment of parameters determining the output of the synchronous motor 41.

The automatic measurement part 117 automatically measures the operating information upon driving while accelerating the synchronous motor 41, at each condition of a first condition based on the base speed, and a second condition in which the D-phase current of the motor drive device 31 was changed from the first condition, according to the above-mentioned test-run program, by applying the above-mentioned initial parameters. For example, in the case of defining the D-phase current during maximum acceleration of the first condition as IDMAX1 (A), defining the Q-phase current during maximum acceleration of the first condition as IQMAX1 (A), defining the D-phase current during maximum acceleration of the second condition as IDMAX2 (A), defining the Q-phase current during maximum acceleration of the second condition as IQMAX2 (A), and defining the maximum value of current as Imax, the condition shall be shown by (IDMAX1, IQMAX1)=Imax×(−sin (15 deg), cos (15 deg)) and (IDMAX2,IQMAX2)=(0, Imax×cos (15 deg)). However, without the Q-phase current changing, IQMAX1=IQMAX2 is defined, and the D-phase current is changed.

The estimation part 118 estimates the inductance ratio Lq/Ld (dimensionless) and Q-phase inductance Lq (mH) as circuit constants of the synchronous motor 41, based on the operating information measured by the automatic measurement part 117. The inductance ratio Lq/Ld (dimensionless) is estimated by the calculation formula $Lq/Ld = 1 + (ACC_{AVE1}/ACC_{AVE2} - 1) \times (Isc/|ID_{AVE2} - ID_{AVE1}|)$, using the operating information. The Q-phase inductance Lq (mH) is estimated by the calculation formula $Lq = (Lq/Ld) \times Ld$, using the operating information. It should be noted that the suffix "AVE1" attached to reference symbols expressing each numerical value indicates the average value of this numerical value in the first condition, and the suffix "AVE2" attached to reference symbols expressing each numerical value indicates the average value of this numerical value in the second condition. It should be noted that the short circuit current Isc (Arms), although a known value herein; however, it may be estimated by the calculation formula $Isc = (ID_{AVE1} - (VDC_{AVE1} \times VQCMD_{AVE1}/(VDC_{AVE2} \times VQCMD_{AVE2})) \times ID_{AVE2})/((VDC_{AVE1} \times VQCMD_{AVE1}/(VDC_{AVE2} \times VQCMD_{AVE2})) - 1) \times (1/2^{1/2})$, using the operating information. In addition, the D-phase inductance Ld (mH), although a known value herein, may be estimated by the calculation formula $Ld = (Ke/3^{1/2}) \times (1/Poles) \times (1/(1000 \times 2\pi/60)) \times (1/Isc) \times 1000$, using the operating information. In addition, the reverse voltage constant Ke (V/krpm), although a known value herein, may be estimated by the calculation formula $Ke = (1000/SPEED_{AVE}) \times (VDC_{ACE}/(2^{1/2})) \times (VQCMD_{AVE}/100)$, using the operating information. It should be noted that the suffix "AVE" attached to reference symbols expressing each numerical value indicates the average value of this numerical value.

The calculation part 119 performs calculation of the optimum parameter tailored to the output specification of the synchronous motor 41, based on the circuit constants estimated by the estimation part 118.

The display part 120 displays various information on a display (not shown) equipped to the parameter determination support device 11. "Various information" herein includes at least one among the operating information measured by the automatic measurement part 117, the circuit constant estimated by the estimation part 118, and the optimum parameter calculated by the calculation part 119. It should be noted that the display part 120 may display navigation information, which serves as a guide for the operator to input output specification information using the input unit 113 described later. It should be noted that this navigation information is not limited in the input method of output specification information and, for example, may include information such as the operating method of the parameter determination support device 11.

The detection unit 112 is a device which detects the specification information of the motor drive device 31 and, for example, is a sensor. In addition, the input unit 113 is a device used in order for the operator to input the output specification information of the synchronous motor 41 and, for example, is a keyboard and/or touch panel.

Figure 3:
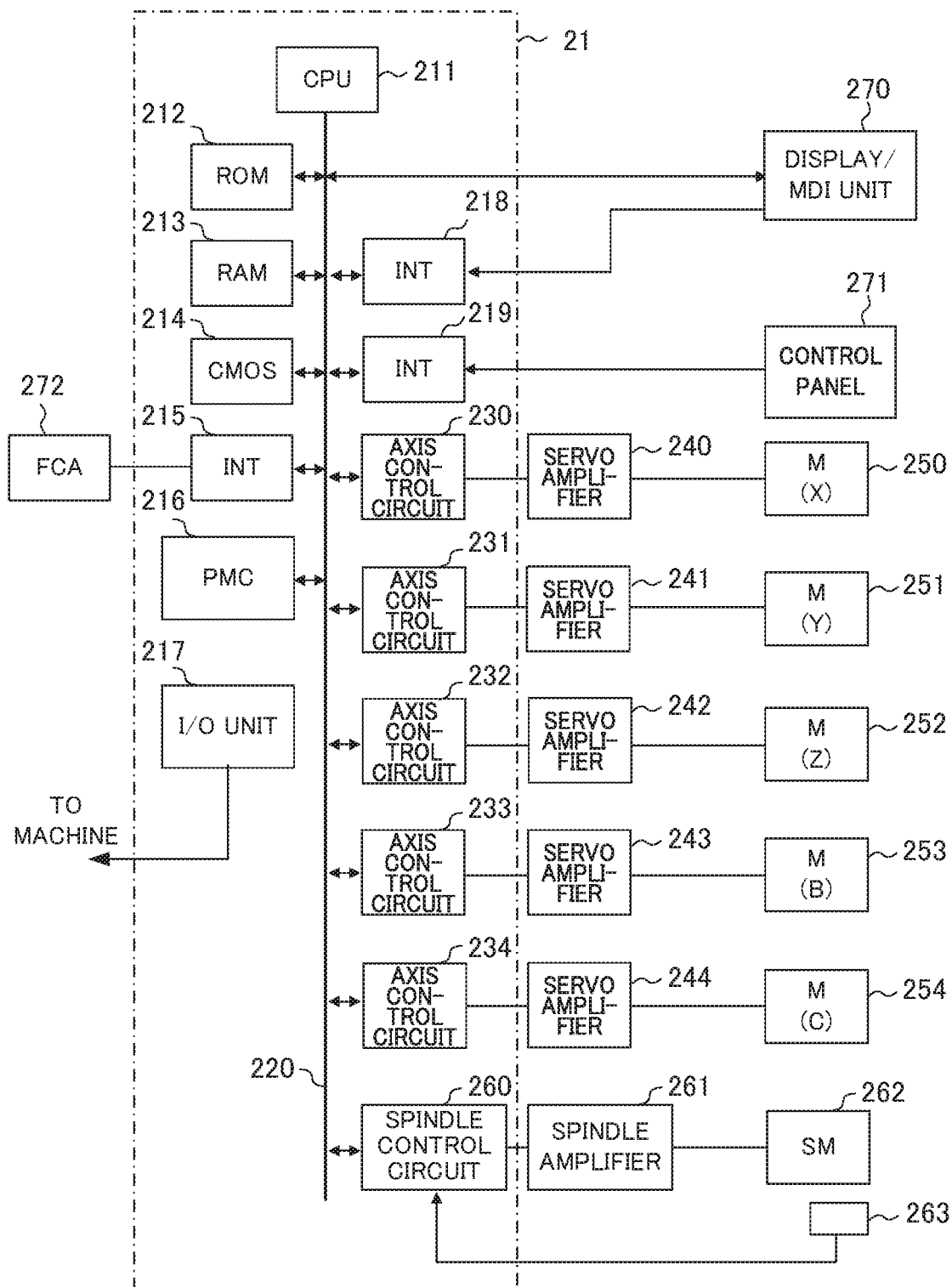
FIG. 3 is a block diagram showing the configuration of a numerical control device shown in FIG. 1.

FIG. 3 shows the configuration of the numerical control device 21. The numerical control device 21 mainly includes a CPU 211, ROM 212, RAM 213, CMOS 214, interfaces 215, 218, 219, PMC (Programmable Machine Controller) 216, I/O unit 217, axis control circuits 230 to 234, and spindle control circuit 260.

The CPU 211 is a processor which controls the numerical control device 21 overall. The CPU 211 reads out a system program stored in the ROM 212 via the bus 220, and controls the numerical control device 21 overall in accordance with this system program.

Temporary calculation data, display data and various data inputted by the operator via the display/MDI unit 270 are stored in the RAM 213.

The CMOS memory 214 is configured as non-volatile memory which is backed up by a battery (not shown), and the stored state is maintained even when the power source of the numerical control device 21 is turned OFF. Machining programs read via the interface 215, machining programs inputted via the display/MDI unit 270, etc. are stored in the CMOS memory 214.

Various system programs for conducting processing of an editing mode necessitated for the creation and editing of machining programs, and processing for automatic operation are written in advance in the ROM 212.

The various machining programs can be inputted via the interface 215 or display/MDI unit 270, and stored in the CMOS memory 214.

The interface 215 enables connection of the numerical control device 21 and external equipment 272 such as adapters. From the external equipment 272 side, a machining program, various parameters, etc. are read. In addition, the machining program edited in the numerical control device 21 can be made to store an external storage means via the external equipment 272.

The PMC (Programmable Machine Controller) 216 controls by outputting signals via the I/O unit 217 to control auxiliary equipment such a machine tools (for example, actuators such as robot hands for tool exchange) by a sequence program built into the numerical control device 21. In addition, after receiving signals such as of various switches on a control panel disposed to the main body of the machine tool, and doing the required signal processing, transfers them to the CPU 211.

The display/MDI unit 270 is a manual data input device equipped with a display, keyboard, etc., and the interface 218 receives commands and/or data from the keyboard of the display/MDI unit 270 and transfers to the CPU 211. The interface 219 is connected to the control panel 271 equipped with a manual pulse generator, etc.

The axis control circuits 230 to 234 of each axis receive movement command amounts of each axis from the CPU 211, and output the command of each axis to the servo amplifiers 240 to 244. The servo amplifiers 240 to 244 receive these commands, and drive the servomotors 250 to 254 of each axis. The servomotors 250 to 254 of each axis are equipped with a position/speed detector, and feedback a position/speed feedback signal from this position/speed detector to the axis control circuits 230 to 234 to perform feedback control of the position/speed. It should be noted that, in FIG. 3, the feedback of position/speed is omitted.

The spindle control circuit 260 receives a spindle rotation command to the machine tool, and outputs a spindle speed signal to a spindle amplifier 261. The spindle amplifier 261 receives this spindle speed signal, and causes the spindle motor 262 of the machine tool to rotate at the commanded rotation speed, thereby driving the tool. To the spindle motor 262, a pulse encoder 263 is joined to the spindle motor 262 by gears, belt or the like, the pulse encoder 263 outputs a return pulse synchronous with the rotation of the spindle, and this return pulse passes through the bus 220 and is read by the CPU 211.

It should be noted that the servo amplifier 240 to 244 and the spindle amplifier 261 correspond to the motor drive device 31 in FIG. 1, and the servomotors 250 to 254 and spindle motor 262 correspond to the synchronous motor 41 in FIG. 1. In addition, the configuration of the numerical control device 21 shown in FIG. 3 is ultimately just an example and is not limited thereto, and it is possible to employ a generic numerical control device as the numerical control device 21.

Figure 4:
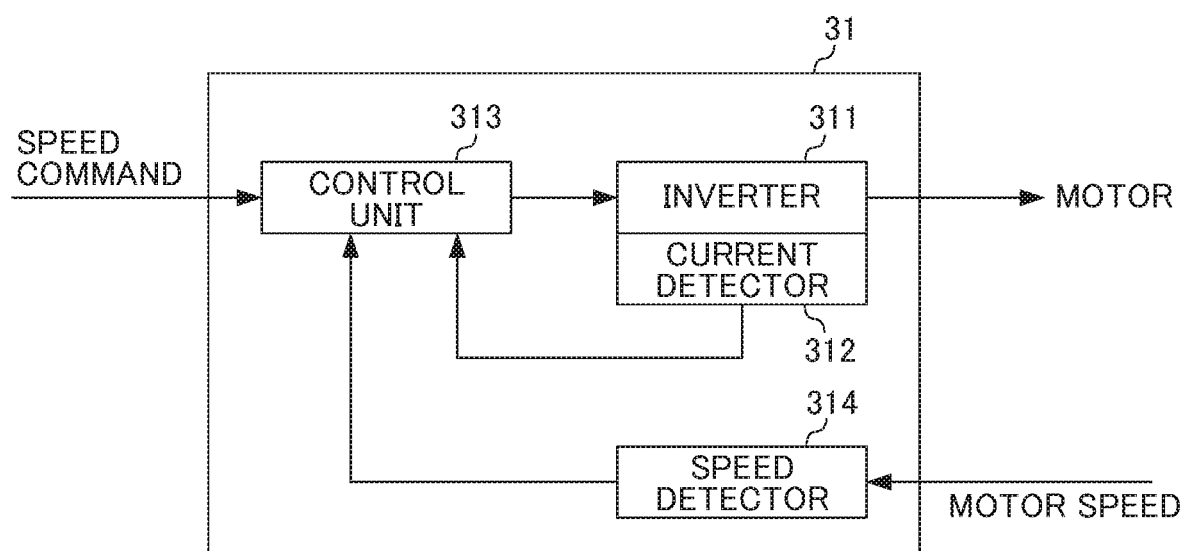
FIG. 4 is a block diagram showing the configuration of a motor drive device shown in FIG. 1.

FIG. 4 shows the configuration of the motor drive device 31. The motor drive device 31 includes an inverter 311, current detector 312, controller 313 and speed detector 314.

The inverter 311 supplies drive current to the synchronous motor 41. The current detector 312 detects the drive current being supplied to the synchronous motor 41. The controller 313 uses the speed command of the motor, the speed feedback of the synchronous motor 41 and the current value detected by the current detector 312 to conduct PWM control on the inverter 311. The speed detector 314 detects the speed for feedback control of the synchronous motor 41, and transmits the detected speed to the controller 313.

The configuration of the motor drive device 31 shown in FIG. 4 is ultimately just an example and is not limited thereto, and it is possible to employ a generic motor drive device as the motor drive device 31.

Figure 5:
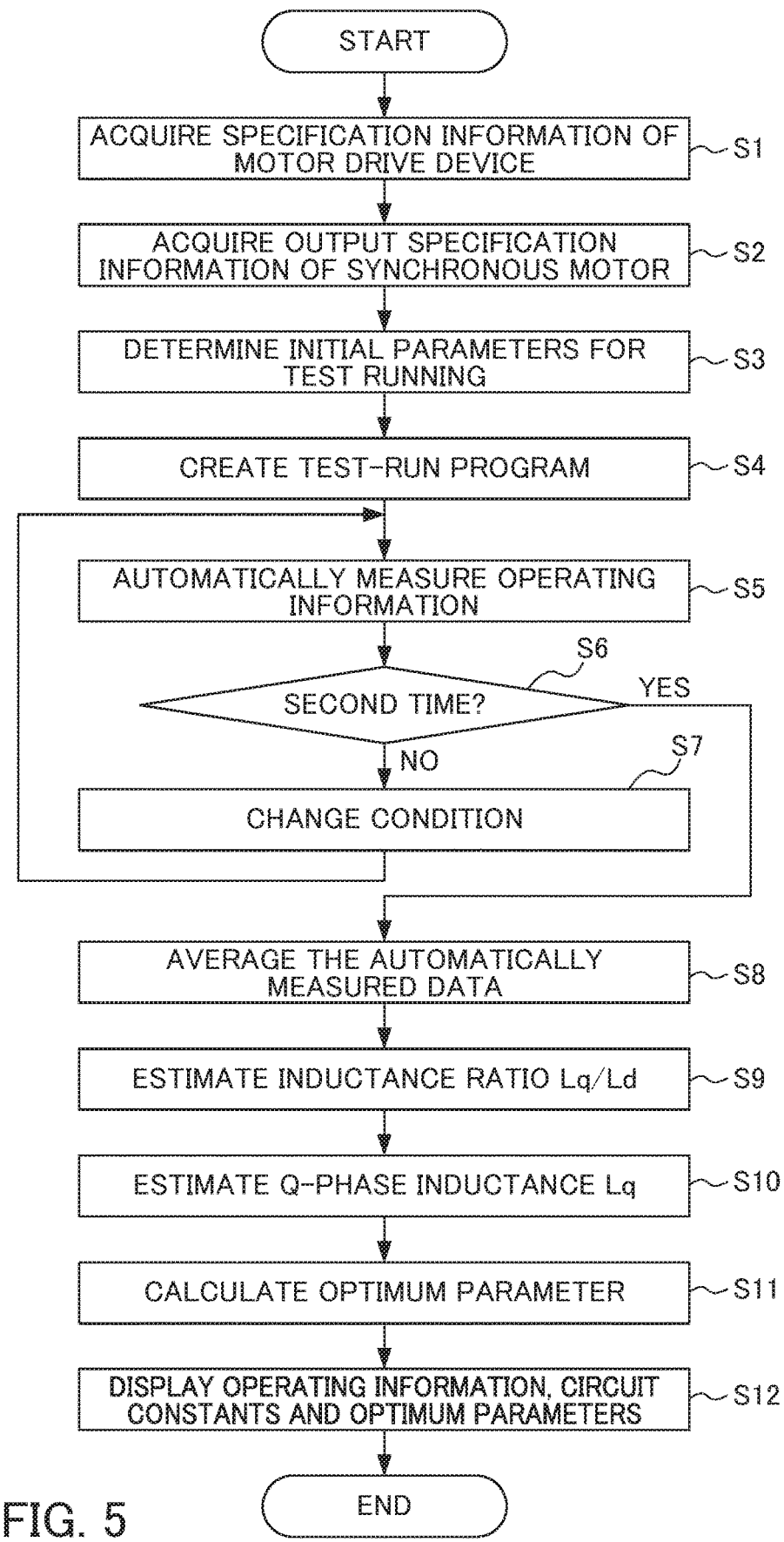
FIG. 5 is a flowchart illustrating the operation of the parameter determination support device shown in FIG. 1.

FIG. 5 is a flowchart illustrating operation of the parameter determination support device 11. In Step S1, the detection unit 112 detects the specification information of the motor drive device 31, and the acquisition part 114 acquires specification information from the detection unit 112.

In Step S2, the operator inputs the output specification information of the synchronous motor 41 from the input unit 113, and the acquisition part 114 acquires the output specification information from the input unit 113.

In Step S3, the initial parameter determination part 115 determines the initial parameter for test running based on the specification information and output specification information acquired by the acquisition part 114.

In Step S4, the program creation part 116 creates a test-run program for test running to acquire the data necessary in the estimation of the circuit constants of the synchronous motor 41 and the adjustment of the parameters determining the output of the synchronous motor 41, based on the output specification information acquired by the acquisition part 114.

In Step S5, the automatic measurement part 117 automatically measures the acceleration ACC (rpm/s) of the synchronous motor and D-phase current ID (A) of the motor drive device 31 as operating information upon driving while accelerating the synchronous motor 41, under the first condition or second condition, according to the test-run program.

In Step S6, it is determined whether the processing of Step S5 was repeated twice.

In the case of NO in Step S6 (case of processing of Step S5 not being repeated twice, the condition upon driving the synchronous motor 41 is changed in Step S7.

In Step S6, the respective data during constant operation which was automatically measured by the automatic measurement part 117 is automatically extracted and this data is averaged. It is thereby possible to eliminate the error in local values from noise, speed variation, etc., and consequently, can raise the statistical reliability of the measurement data.

In Step S9, the estimation part 118 estimates the inductance ratio Lq/Ld (dimensionless) as a circuit constant of the synchronous motor 41 by automatically calculating based on the operating information which was automatically measured by the automatic measurement part 117.

In Step S10, the estimation part 118 estimates the Q-phase inductance Lq (mH) as the circuit constant of the synchronous motor 41 by automatically calculating based on the operating information which was automatically measured by the automatic measurement part 117. More specifically, in Step S10, the estimation part 118 estimates the Q-phase inductance Ld (mH) by automatically calculating using the inductance ratio Lq/Ld (dimensionless) estimated based on the operating information which was automatically measured by the automatic measurement part 117.

In Step S11, the calculation part 119 calculates to determine the optimum parameter tailored to the output specification of the synchronous motor 41 based on the circuit constants estimated by the estimation part 118.

In Step S12, the display part 120 exchangeably displays on the display (not shown) the operating information which was automatically measured by the automatic measurement part 117, the circuit constants estimated by the estimation part 118, and the optimum parameter calculated by the calculation part 119. It thereby becomes possible for the operator to judge whether the parameter determined in Step S11 is appropriate, while directly confirming the measurement data. According to the above, the operation flow of the parameter determination support device 11 ends.

It should be noted that, in the flowchart illustrated in FIG. 5, after executing the processing of Step S12, it may trace back to the steps before, and execute the processing of the step traced back and later again. For example, after displaying the parameter in Step S12, the parameter determination support device 11 may correct the parameter by executing the processing of Step S5 and later again.

Figure 6:
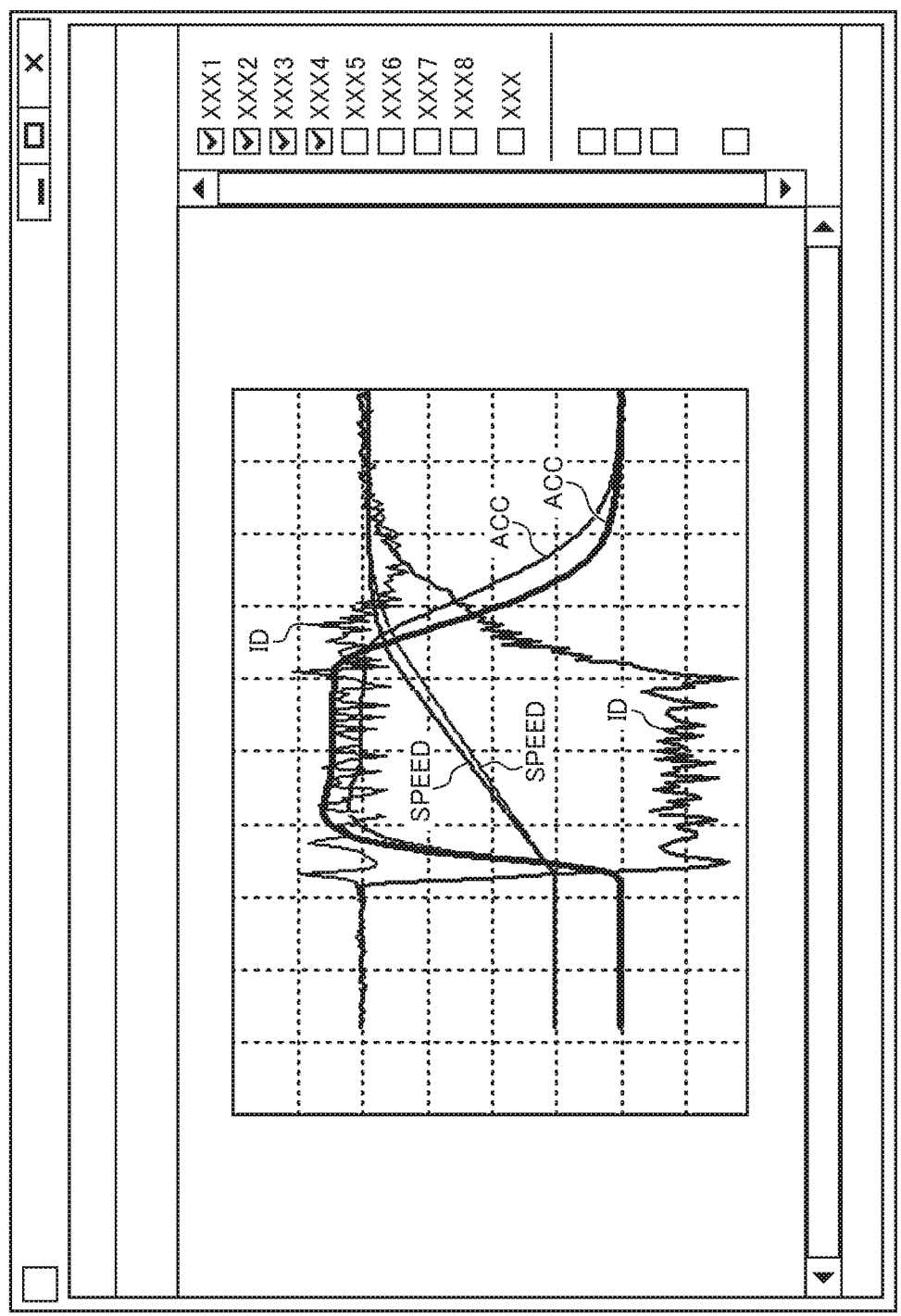
FIG. 6 is a view showing a screen displaying measured operating information on a display.
Figure 7:
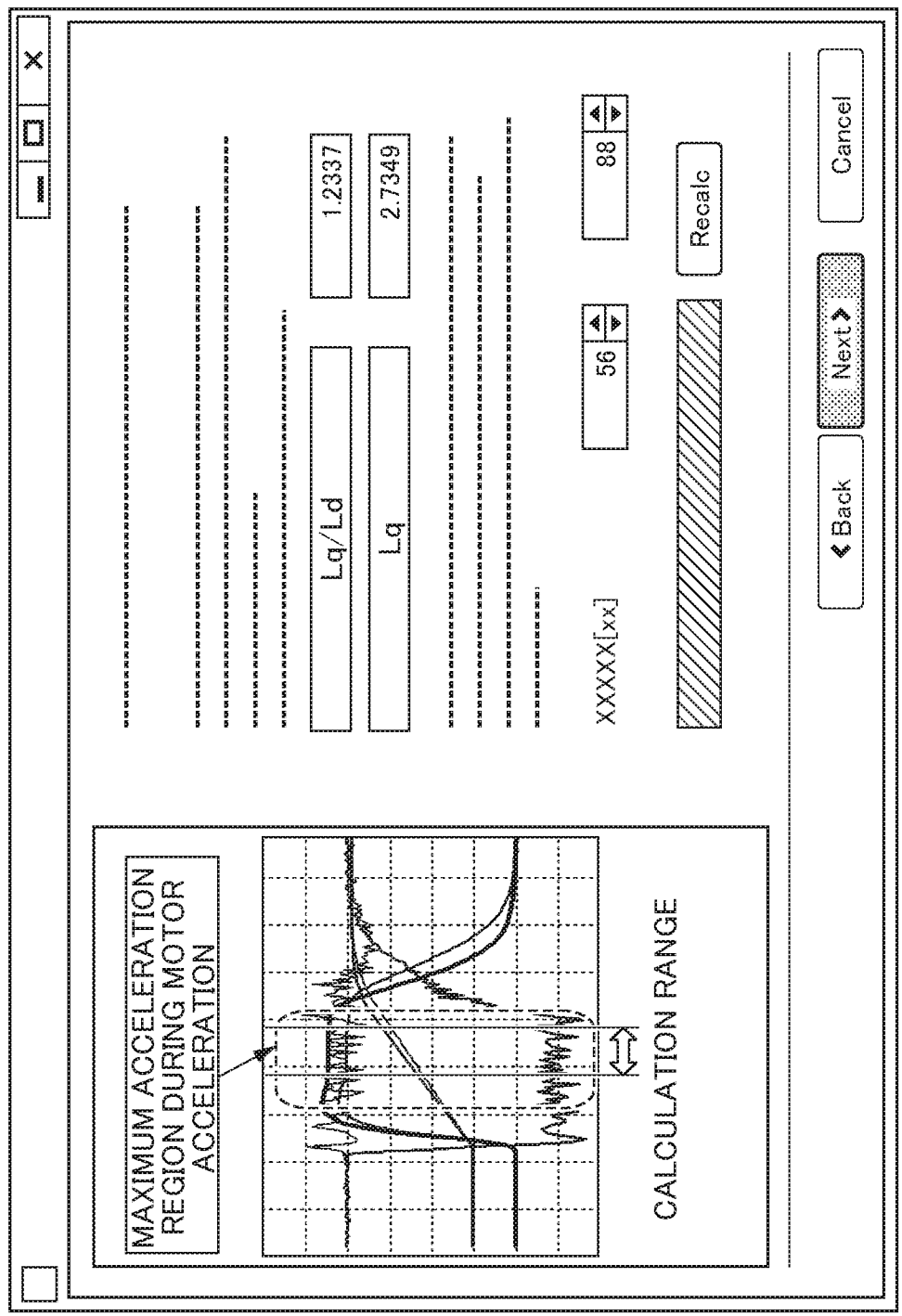
FIG. 7 is a view showing a screen displaying estimated circuit constants on a display.

FIG. 6 shows a screen displaying the measured operating information on the display (not shown). FIG. 7 shows a screen displaying the estimated circuit constants on the display (not shown). FIG. 8 shows a screen displaying calculated optimum parameters on the display (not shown). As shown in FIG. 6, in Step S10 of the flowchart illustrated in FIG. 5, as the operating information which was automatically measured by the automatic measurement part 117, time history waveforms of each of the revolution speed SPEED (rpm) and acceleration ACC (rpm/s) of the synchronous motor 41, as well as the D-phase current ID (A) of the motor drive device 31 are displayed on the display (not shown). In addition, as shown in FIG. 7, each of the inductance ratio Lq/Ld (dimensionless) and Q-phase inductance Lq (mH) is displayed as circuit constants estimated by the estimation part 118, by switching the display on the display (not shown). At this time, for each waveform shown in FIG. 6, the display displays together the region in which acceleration reaches a maximum (region surrounded by dotted line), and in this region, the calculation range (range of arrows) in which calculation of the above-mentioned inductance ratio Lq/Ld and Q-phase inductance Lq was performed. In addition, as shown in FIG. 8, the display (not shown) displays various optimum parameters calculated by the calculation part 119, by switching the display.

The above-mentioned parameter determination support device 11, by applying the initial parameters, automatically measures the D-phase current ID (A) of the motor drive device 31, as operating information upon driving while accelerating the synchronous motor 41 under each condition of a first condition based on the base speed, and a second condition in which the D-phase current ID (A) of the motor drive device 31 was changed from the first condition, according to the test-run program; estimates the inductance ratio Lq/Ld (dimensionless) and Q-phase inductance Lq (mH) as the circuit constants of the synchronous motor 41 based on this operating information, and calculates the optimum parameters according to the output specifications of the synchronous motor 41, based on these circuit constants.

It thereby becomes possible to simplify the determination of drive parameters upon driving a synchronous motor 41 for which the circuit constants are unknown, and shorten the time required in determination.

In addition, the above-mentioned parameter determination support device 11 further includes the display part 120 which displays at least one among the measured operating information, the estimated circuit constant, and the calculated optimum parameter.

Since the operator thereby judges the validity of the parameter by confirming by what kind of logic a parameter is determined, and what kind of output is made as a result thereof, it is possible to determine the optimum parameter.

It should be noted that each device included in the above-mentioned parameter determination support device 11 can be respectively realized by hardware, software, or a combination of these. In addition, the parameter determination method performed by each device included in the above-mentioned parameter determination support device 11 can also be realized by hardware, software or a combination of these. Herein, realized by software indicates the matter of being realized by a computer reading out and executing a program.

The programs can be stored using a variety of types of non-transitory computer readable media, and supplied to the computer. The non-transitory computer readable media includes varies types of tangible storage media. Examples of non-transitory computer readable media include magnetic media (for example, flexible disks, magnetic tape, hard disk drive), magneto-optical recording media (for example, magneto-optical disk), CD-ROM (Read Only Memory), CD-R, CD-R/W, and semiconductor memory (for example, mask ROM, PROM (Programmable ROM), EPROM (Erasable PROM), flash ROM, RAM (random access memory)). In addition, the program may be supplied to the computer by various types of transitory computer readable media. Examples of transitory computer readable media include electrical signals, optical signals and electromagnetic waves. The transitory computer readable media can supply programs to a computer via a wired communication path such as electrical lines and optical fibers, or a wireless communication path.

It should be noted that the above-mentioned embodiment explains an example of a case in which the automatic measurement part 117 automatically measures the operating information twice; however, the present invention is not limited thereto, and may be configured so as to automatically measure three or more times and use the average value. By increasing the number of times that the automatic measurement part 17 automatically measures and then uses the average value, it is possible to eliminate error in local values from noise, speed fluctuation, etc., and consequently, the statistical reliability of the measurement data can be improved.

EXPLANATION OF REFERENCE NUMERALS

1 motor drive system
11 parameter determination support device
21 numerical control device
31 motor drive device
41 synchronous motor
111 control unit
112 detection unit
113 input unit
114 acquisition part
115 initial parameter determination part
116 program creation part
117 automatic measurement part
118 estimation part
119 calculation part
120 display part

What is claimed is:

1. A parameter determination support device for motor driving, comprising:
    an acquisition means for acquiring specification information of a motor drive device and output specification information of a synchronous motor;
    an initial parameter determination means for determining an initial parameter for test running, based on the specification information and the output specification information, the test running causing the synchronous motor to drive in order for confirmation of drive current value, drive voltage value, revolution speed of the synchronous motor when rotating the synchronous motor at a substantially constant revolution speed, when accelerating, or when decelerating;
    a program creation means for creating a test-run program used for acquiring data that is required for adjustment of a parameter that determines output of the synchronous motor, based on the output specification information;
    an automatic measurement means for automatically measuring acceleration of the synchronous motor and a D-phase current of the motor drive device, as operating information upon driving while accelerating the synchronous motor under each condition of a first condition based on a base speed, and a second condition in which the D-phase current of the motor drive device is changed from the first condition, according to the test-run program, by applying the initial parameter;

an estimation means for estimating an inductance ratio and a Q-phase inductance, as circuit constants of the synchronous motor, based on the operating information; and a calculation means for performing calculation of an optimum parameter tailored to the output specification of the synchronous motor, based on the circuit constants, wherein said initial parameters include at least one among a maximum current value for driving the synchronous motor, D-phase current value, a highest revolution speed of the synchronous motor, and a coefficient converting the feedback of current value introduced from the motor drive device into an actual physical quantity, said output specification information includes at least one among a rated output and base revolution speed of the synchronous motor, the D-phase current is a current flowing through a D-axis coil when the synchronous motor is represented as a two-phase equivalent circuit corresponding to a D-axis, which is a magnetic field direction created by a rotor of the synchronous motor, and a Q-axis, which is a magnetic field direction perpendicular to the D-axis, and the Q-phase inductance is an ease of passage of magnetic flux in a Q-axis magnetic path when the synchronous motor is represented as the two-phase equivalent circuit corresponding to the D-axis and the Q-axis.

2. The parameter determination support device according to claim 1, further comprising a display means for displaying at least one among the operating information, the circuit constants, and the optimum parameter.

3. A computer readable medium encoded with a program for causing a computer to operate as the parameter determination support device according to claim 1.

4. A computer readable medium encoded with a program for causing a computer to operate as the parameter determination support device according to claim 2.

* * * * *